United States Patent
Dyer et al.

(10) Patent No.: US 7,952,447 B2
(45) Date of Patent: May 31, 2011

(54) ADAPTIVE EMI REDUCTION TECHNIQUE FOR WIRELINE PHYS IN MULTI-PORT APPLICATIONS

(75) Inventors: Kenneth C. Dyer, Davis, CA (US); Harvey Scull, Naperville, IL (US)

(73) Assignee: Vintomie Networks B.V., LLC, Dover, DE (US)

( * ) Notice: Subject to any disclaimer, the term of this patent is extended or adjusted under 35 U.S.C. 154(b) by 493 days.

(21) Appl. No.: 12/011,204

(22) Filed: Jan. 23, 2008

(65) Prior Publication Data

US 2009/0021291 A1  Jan. 22, 2009

Related U.S. Application Data

(60) Provisional application No. 60/900,180, filed on Feb. 7, 2007.

(51) Int. Cl.
*H04B 3/28* (2006.01)
(52) U.S. Cl. .......................................... 333/12; 333/17.1
(58) Field of Classification Search .................... 333/14; 455/67.13, 295, 296; 375/346, 257; 324/628
See application file for complete search history.

(56) References Cited

U.S. PATENT DOCUMENTS

| | | | | |
|---|---|---|---|---|
| 5,327,093 A * | 7/1994 | Bolla et al. | ..................... | 329/308 |
| 5,584,065 A * | 12/1996 | Monzello | ...................... | 455/296 |
| 6,229,797 B1 * | 5/2001 | Cho | .............................. | 370/342 |
| 6,472,947 B1 * | 10/2002 | Zeitz | ............................ | 333/17.1 |
| 7,561,847 B2 * | 7/2009 | Nagai et al. | ..................... | 455/65 |
| 2004/0146061 A1 * | 7/2004 | Bisceglia et al. | ............. | 370/419 |
| 2005/0024026 A1 * | 2/2005 | Hung et al. | ................... | 323/255 |
| 2005/0266819 A1 * | 12/2005 | Boos | ............................ | 455/295 |
| 2008/0068978 A1 * | 3/2008 | Clausen | ....................... | 370/201 |

\* cited by examiner

*Primary Examiner* — Robert Pascal
*Assistant Examiner* — Alan Wong
(74) *Attorney, Agent, or Firm* — Dorsey & Whitney, LLP

(57) ABSTRACT

An adaptive electromagnetic interference (EMI) detection and reduction device for multi-port applications is provided. The invention includes at least two physical devices (PHY), where the PHYs transmit data along wire pairs to a register jack (RJ). The transmissions create EMI along the wire pairs, where the transmissions have constructively interfering resonant frequencies having phases and amplitudes. An antenna is disposed proximal to each RJ, where the antennae detect each frequency. A resonating network determines a peak amplitude of each frequency, an envelope detector amplifies each peak amplitude from the resonating network. A discretization circuit converts the amplified peak to discrete amplitude values, where the discretization circuit transmits the discrete amplitude values to a controller. The controller receives the discrete amplitude values from the discretization circuit, and communicates with each PHY, where a phase or frequency of the PHY signal is modified to minimize the constructive interference between the resonant frequencies.

25 Claims, 1 Drawing Sheet

US 7,952,447 B2

ADAPTIVE EMI REDUCTION TECHNIQUE FOR WIRELINE PHYS IN MULTI-PORT APPLICATIONS

CROSS-REFERENCE TO RELATED APPLICATIONS

This application is cross-referenced to and claims the benefit from U.S. Provisional Patent Application 60/900,180 filed Feb. 7, 2007, which is hereby incorporated by reference.

FIELD OF THE INVENTION

The invention relates generally to electronic communication systems. More particularly, the invention relates to reducing electromagnetic interference (EMI) radiation in multi-port electronic communication systems.

BACKGROUND

In a multi-port application, where several wire-line physical devices (PHYS) are physically near each other, EMI radiation can constructively interfere. A primary point of EMI emission is the register jack (RJ), which when "unbalanced" can convert a differential signal to an unbalanced signal that radiates. Multi-port applications such as switches in a data center can radiate EMI energy that constructively interferes, causing FCC compliance problems. The source of EMI radiation may be from inside and/or outside a multi-port housing or box.

Accordingly, there is a need to develop a device that detects and minimizes the EMI radiation of multiple adjacent ports in one box or between multiple boxes.

SUMMARY OF THE INVENTION

The current invention is an adaptive electromagnetic interference (EMI) detection and reduction device for multi-port applications. The invention includes at least two physical devices (PHY), where the PHYs transmit data along wire pairs to a register jack (RJ). The transmissions create the EMI along the wire pairs, where the transmissions have constructively interfering resonant frequencies having phases and amplitudes. An antenna is disposed proximal to or in each RJ, where the antennae detect each resonant frequency. A resonating network determines a peak amplitude of each resonant frequency, an envelope detector amplifies each peak amplitude from the resonating network. A discretization circuit converts the amplified peak to discrete amplitude values, where the discretization circuit transmits the discrete amplitude values to a controller. The controller receives the discrete amplitude values from the discretization circuit, and communicates with each PHY, where a phase of the PHY transmit signal is modified to a condition to minimize the constructive interference between the resonant frequencies.

In one aspect of the invention, the discretization circuit can be an analog to digital converter (ADC) or a threshold detection circuit.

In another aspect of the invention, a frequency of the PHY transmit signal is modified to a condition to minimize the constructive interference between the resonant frequencies.

In a further aspect of the invention, the antenna is deployed within a distance between ¼ to 100 resonant wavelengths of the RJ.

In a further aspect of the invention, the RJ is either an ANSI Category-5, 5e, 6, 6a or ISO Category-7 connector.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

The current invention detects the radiated energy and configures the transmitters inside the wireline transmitters to operate in different phases, such that the radiated energy does not constructively interfere. This reduces the radiated emissions. Because the EMI is detected, it can be minimized at the detection point for any number of wireline PHYS or "ports".

A primary point of EMI emission is the RJ, which is "unbalanced" and can convert a differential signal to an unbalanced signal that radiates. Further, in multi-port applications, such as switches in a data center, the radiated EMI energy can constructively interfere, causing FCC compliance problems. The current invention addresses these problems by minimizing the EMI radiation of multiple adjacent ports, where the EMI source is detected directly. The source may be inside or outside the box, or from a neighboring multi-port box, such as a switch room, that constructively interfere. The current invention minimizes EMI form combined interference of several multi-port boxes or in an individually deployed box.

Figure 1:
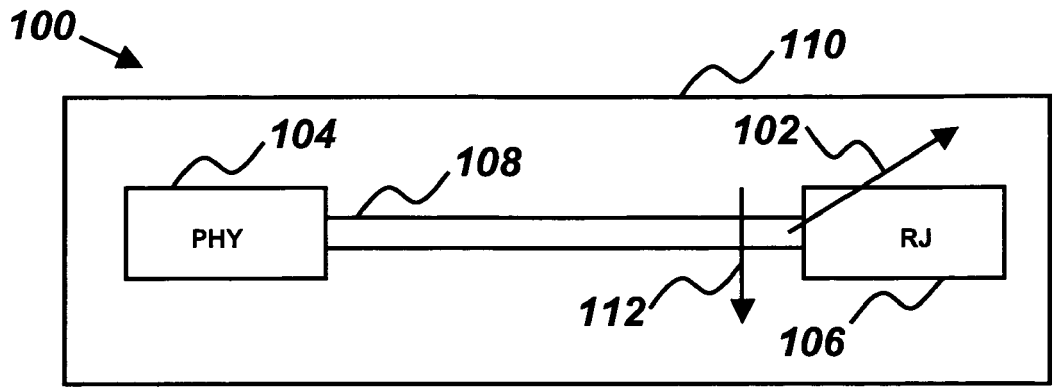
FIG. 1 shows a block diagram of a prior art single port of a multi-port application producing EMI radiation.

FIG. 1 shows a block diagram of a prior art single port 100 of a multi-port application (not shown) producing EMI radiation 102, where the port 100 includes a PHY 104 and a register jack (RJ) 106 connected by a pair of wire traces 108 on a PCB 110. In this typical configuration, a dipole antenna is formed to produce EMI radiation 102. Further shown is a common mode reflection 112 created by the wire traces 108, which can further contribute the EMI radiation 102. The RJ 106 can be either an ANSI Category-5, 5e, 6, 6a or ISO Category-7 connector.

Figure 2:
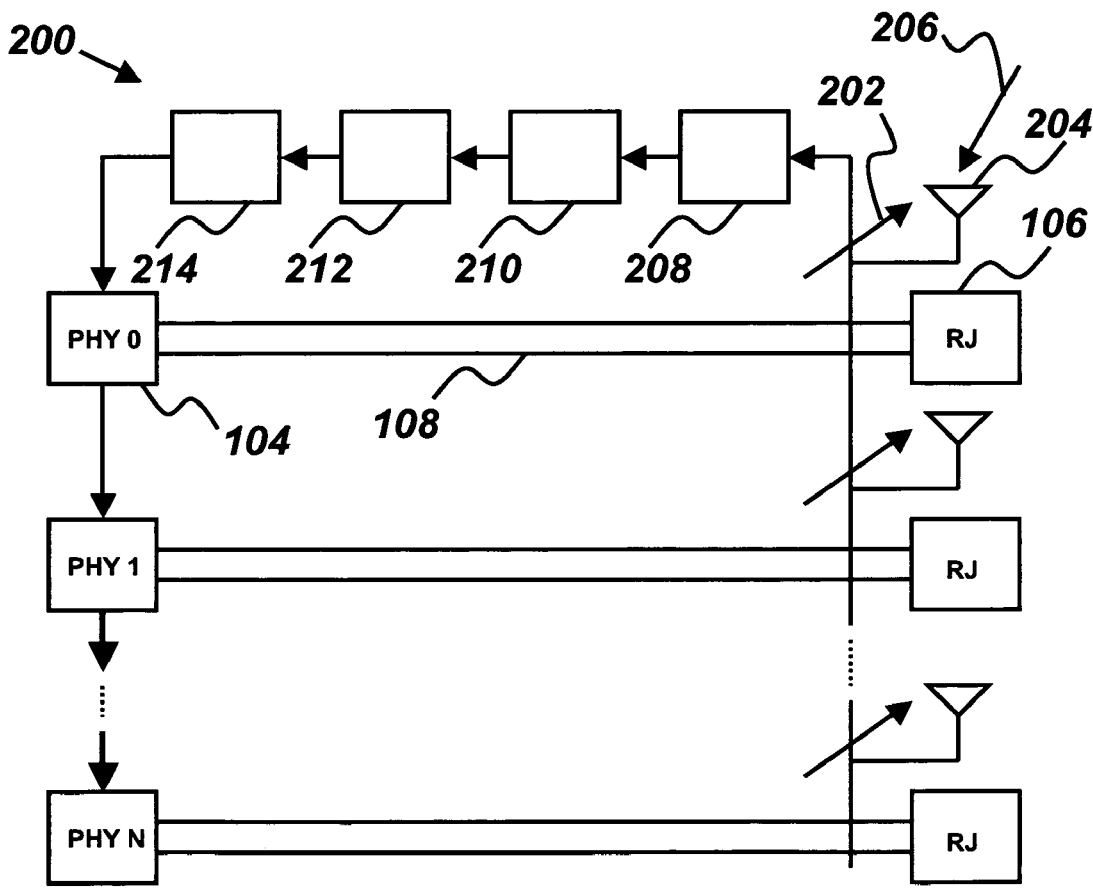
FIG. 2 shows a block diagram of a of an EMI detection and reduction system for multi-port applications according to the present invention.

FIG. 2 shows a block diagram of an EMI detection and reduction system 200 for multi-port applications according to the present invention. The invention includes at least two PHYs 104, where the PHYs 104 transmit data along wire pairs 108 to an RJ 106. The transmissions create internal EMI 202 along the wire pairs 108, where the transmissions have constructively interfering resonant frequencies having phases and amplitudes. An antenna 204 is disposed proximal to each RJ 106, where the antennae 204 detect each resonant frequency from the internal EMI 202 and/or an external EMI 206. The antenna 204 can be deployed inside or outside the box (not shown), inside the RJ 106, or within a distance between ¼ to 100 resonant wavelengths of the RJ 106. A resonating network 208 determines the peak amplitude of each resonant frequency, and an envelope detector 210 amplifies each peak-amplitude received from the resonating network 208. A discretization circuit 212 converts the amplified peak into discrete amplitude values, where the discretization circuit 212 can be an analog to digital converter (ADC) or a threshold detection circuit. The discretization circuit 212 transmits the discrete amplitude values to a controller 214. The controller 214 receives the discrete amplitude values from the discretization circuit 212, and communicates with each PHY 104, where a phase or frequency of the PHY 104 transmit signal is modified to a condition to minimize the constructive interference between the resonant frequencies.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, in a 10G-Base T Ethernet application, four PHYs are used in parallel and the invention may be applied to sense the radiated EMI from each of the four pairs. If the EMI is adding constructively, phase delay may be added to some of the PHYs to reduce the total EMI to within specification.

All such variations are considered to be within the scope and spirit of the present invention as defined by the following claims and their legal equivalents.

What is claimed:

1. An adaptive electromagnetic interference (EMI) reduction system comprising:
    at least two physical devices configured to transmit data signals along respective wire pairs to respective register jacks, wherein at least one of the physical devices is further configured to alter at least one of a phase or an amplitude of at least one of the transmitted data signals in response to a control signal;
    an antenna configured to detect EMI proximal to at least one of the register jacks; and
    a controller configured to generate the control signal based, at least in part, on the detected EMI.

2. The adaptive EMI reduction system of claim 1, wherein the register jacks are each selected from a group consisting of an ANSI Category-5, ANSI Category-5e, ANSI Category-6, ANSI Category-6a, and ISO Category-7 connector.

3. The adaptive EMI reduction system of claim 1, wherein the at least one physical device is configured to alter a frequency of at least one of the transmitted data signals to minimize constructive interference between EMI generated, at least in part, by the data signals transmitted along respective wire pairs.

4. The adaptive EMI reduction system of claim 1, wherein the antenna is located within a distance between ¼ to 100 resonant wavelengths of a frequency of the detected EMI.

5. The adaptive EMI reduction system of claim 1, wherein the data signals transmitted along respective wire pairs to respective register jacks constructively interfere at a resonant frequency, wherein the antenna is further configured to detect EMI at the resonant frequency, and wherein the system further comprises:
    a resonating network configured to determine a peak amplitude of the resonant frequency;
    an envelope detector configured to amplify the peak amplitude; and
    a discretization circuit configured to convert the peak amplitude into at least one discrete amplitude value, wherein the discrete amplitude value is configured to be used by the controller in the control signal.

6. The adaptive EMI reduction system of claim 5, wherein the discretization circuit is selected from a group consisting of an analog-to-digital converter (ADC) and a threshold detection circuit.

7. The adaptive EMI reduction system of claim 1, wherein at least one of the physical devices is further configured to add a phase delay to the transmitted data signal to reduce total EMI.

8. The adaptive EMI reduction system of claim 1, further comprising a box at least partially enclosing the at least two physical devices and the register jacks, wherein the antenna is located outside the box.

9. The adaptive EMI reduction system of claim 1, further comprising a box at least partially enclosing the at least two physical devices and the register jacks, wherein the antenna is located inside the box.

10. A method for reducing electromagnetic interference (EMI), the method comprising:
    detecting EMI at a first location, wherein the first location is proximal to a register jack, and wherein the EMI is generated, at least in part, by constructive interference with a signal being transmitted by a physical device at a second location; and
    altering at least one property of the signal being transmitted by the physical device at the second location based on the detected EMI at the first location.

11. The method of claim 10, wherein said detecting EMI comprises detecting an amplitude of the EMI at a frequency, and wherein said altering at least one property of the signal is based, at least in part, on the detected amplitude.

12. The method of claim 10, wherein the first location further comprises a distance from the register jack of between ¼ and 100 wavelengths of a frequency of the detected EMI.

13. A method for reducing electromagnetic interference (EMI), the method comprising:
    detecting EMI at a first location, wherein the EMI is generated, at least in part, by constructive interference with a signal being transmitted by a transmitting device at a second location; and
    altering at least a frequency of the signal being transmitted by the transmitting device at the second location based on the detected EMI at the first location to reduce the detected EMI.

14. The method of claim 13, wherein the first location comprises a location proximal to a register jack, and wherein the transmitting device comprises a physical device.

15. The method of claim 13, wherein said detecting EMI comprises detecting an amplitude of the EMI at a frequency, and wherein said altering at least a frequency of the signal is based, at least in part, on the detected amplitude of the EMI.

16. A method of transmitting a data signal to reduce electromagnetic interference (EMI), the method comprising:
    transmitting a data signal having a frequency and a phase from a physical device to a register jack;
    receiving, at the physical device, a control signal indicative of EMI detected at the register jack; and
    altering at least one of the frequency or phase of the data signal transmitted by the physical device in response to the control signal.

17. The method of claim 16, wherein the control signal is further indicative of an amplitude of a frequency of EMI at the register jack.

18. The method of claim 16, wherein the control signal is further indicative of EMI at a distance of between ¼ and 100 wavelengths of a frequency of the EMI away from the register jack.

19. The method of claim 16, wherein said altering at least one of the frequency or phase of the data signal comprises altering a frequency of the data signal.

20. The method of claim 16, wherein said altering at least one of the frequency or phase of the data signal comprises adding a phase delay to the data signal.

21. The method of claim 16, wherein the register jack is selected from a group consisting of an ANSI Category-5, ANSI Category-5e, ANSI Category-6, ANSI Category-6a, and ISO Category-7 connector.

22. A method for reducing electromagnetic interference (EMI), the method comprising:

detecting EMI at a first location, wherein the EMI is generated, at least in part, by constructive interference with a signal being transmitted by a transmitting device at a second location; and adding a phase delay to the signal being transmitted by the transmitting device at the second location based on the detected EMI at the first location to reduce the detected EMI.

23. The method of claim 22, wherein the first location comprises a location proximal to a register jack, and wherein the transmitting device comprises a physical device.

24. The method of claim 22, further comprising altering a frequency of the signal to reduce the detected EMI.

25. The method of claim 22, wherein said detecting EMI comprises detecting an amplitude of the EMI at a frequency, and wherein said adding a phase delay to the signal is based, at least in part, on the detected amplitude of the EMI.

* * * * *